(12) United States Patent
Sasaki

(10) Patent No.: US 9,250,541 B2
(45) Date of Patent: *Feb. 2, 2016

(54) EXPOSURE APPARATUS AND DEVICE FABRICATION METHOD

(71) Applicant: CANON KABUSHIKI KAISHA, Tokyo (JP)

(72) Inventor: Ryo Sasaki, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/138,425

(22) Filed: Dec. 23, 2013

(65) Prior Publication Data

US 2014/0185026 A1    Jul. 3, 2014

(30) Foreign Application Priority Data

Dec. 27, 2012  (JP) ................................. 2012-284351

(51) Int. Cl.
*G03B 27/54* (2006.01)
*G03B 27/52* (2006.01)
*G03F 7/20* (2006.01)

(52) U.S. Cl.
CPC ........ *G03F 7/70558* (2013.01); *G03F 7/70933* (2013.01)

(58) Field of Classification Search
CPC ... G03F 7/20; G03F 7/70133; G03F 7/70558; G03F 7/70933

USPC .................... 355/52, 53, 67–69, 30
See application file for complete search history.

(56) References Cited

U.S. PATENT DOCUMENTS

| 6,295,121 | B1* | 9/2001 | Nakamura ...................... 355/67 |
| 2001/0015795 | A1* | 8/2001 | Nishi ............................. 355/53 |
| 2004/0184015 | A1* | 9/2004 | Kino .............................. 355/30 |
| 2005/0175497 | A1* | 8/2005 | Arai et al. ....................... 422/3 |
| 2006/0033893 | A1* | 2/2006 | Nakano ........................... 355/30 |
| 2011/0102754 | A1  | 5/2011 | Takagi et al. |
| 2014/0185026 | A1* | 7/2014 | Sasaki ............................ 355/67 |

FOREIGN PATENT DOCUMENTS

| JP | 61-051150 A | 3/1986 |
| JP | 01-195445 A | 8/1989 |
| JP | 2011-096859 A | 5/2011 |

* cited by examiner

*Primary Examiner* — Hung Henry Nguyen
(74) *Attorney, Agent, or Firm* — Rossi, Kimms & McDowell LLP

(57) ABSTRACT

The present invention provides an exposure apparatus which expose a substrate, the apparatus including an illumination optical system configured to illuminate a mask using light from a light source, a projection optical system configured to irradiate the substrate with light from a pattern on the mask, an adjustment unit configured to adjust an oxygen concentration in a space between the projection optical system and the substrate, an obtaining unit configured to obtain data of illuminance of light applied to the substrate, and a control unit configured to control the adjustment unit so as to set the oxygen concentration in the space to a predetermined concentration value based on the data of illuminance obtained by the obtaining unit.

17 Claims, 7 Drawing Sheets

EXPOSURE APPARATUS AND DEVICE FABRICATION METHOD

BACKGROUND OF THE INVENTION

1. Field of the Invention

The present invention relates to an exposure apparatus and a device fabrication method.

2. Description of the Related Art

There are available various types of methods of manufacturing a color filter such as a dyeing method, printing method, electrodeposition/electrolysis method, and pigment dispersion method. Among these methods, the pigment dispersion method has been the mainstream because of its manufacturing stability and simplicity. A photosensitive acrylic method as a typical pigment dispersion method forms a pattern by photolithography on a color resist containing an acryloid-based photosensitive resin and having both a coloring function and a photosensitive function.

A color resist is a negative resist. For this reason, irradiating the resist with exposure light will generate radicals contributing to a reaction and photopolymerize a polymer, thereby making it insoluble to a developer. Note however that the pigment components contained in the color resist easily absorb exposure light and the generated radicals are trapped in oxygen in air. This tends to hinder a photopolymerization reaction. In order to obtain predetermined pattern dimensions (shape), therefore, it is necessary to increase the dose (exposure energy), leading to a decrease in throughput.

Under the circumstance, there has been proposed a technique of forming (applying) a film made of polyvinyl alcohol (oxygen shielding film which shields against oxygen) on a resist. Such a technique may cause a pattern defect due to the poor wettability of the oxygen shielding film on the resist. In addition, adding the step of forming an oxygen shielding film will increase the cost. Furthermore, it is not possible to control the oxygen concentration even by forming an oxygen shielding film. This reduces flexibility with respect to accuracy control on pattern dimensions when forming a fine pattern.

On the other hand, Japanese Patent Laid-Open No. 1-195445 has proposed a technique of exposing a resist in a low oxygen state upon blowing nitrogen (gas) against the resist without forming any oxygen shielding film made of polyvinyl alcohol on the resist. A technique of exposing a resist upon changing the oxygen concentration in accordance with the type of resist has also been proposed in Japanese Patent Laid-Open No. 2011-96859.

A conventional technique like that disclosed in Japanese Patent Laid-Open No. 2011-96859 performs exposure upon obtaining an optimal oxygen concentration for each resist by experiments and the like and registering each oxygen concentration in a recipe. In this case, if the illuminance of exposure light on a substrate decreases due to a decrease in the transmittance of an optical system or a decrease in the emission intensity of a light source, the photopolymerization reaction on the resist may change. If the photopolymerization reaction on the resist changes, even exposure with an optimal oxygen concentration obtained in advance may not obtain predetermined pattern dimensions because of a decrease in the illuminance of exposure light. It is therefore conceivable to optimize pattern dimensions by increasing the dose. This will, however, decrease the throughput.

SUMMARY OF THE INVENTION

The present invention provides an exposure apparatus which is advantageous in transferring a pattern onto a substrate while suppressing a decrease in throughput.

According to one aspect of the present invention, there is provided an exposure apparatus which exposes a substrate, the apparatus including an illumination optical system configured to illuminate a mask using light from a light source, a projection optical system configured to irradiate the substrate with light from a pattern on the mask, an adjustment unit configured to adjust an oxygen concentration in a space between the projection optical system and the substrate, an obtaining unit configured to obtain data of illuminance of light applied to the substrate, and a control unit configured to control the adjustment unit so as to set the oxygen concentration in the space to a predetermined concentration value based on the data of illuminance obtained by the obtaining unit.

Further aspects of the present invention will become apparent from the following description of exemplary embodiments with reference to the attached drawings.

DESCRIPTION OF THE EMBODIMENTS

Figure 1:
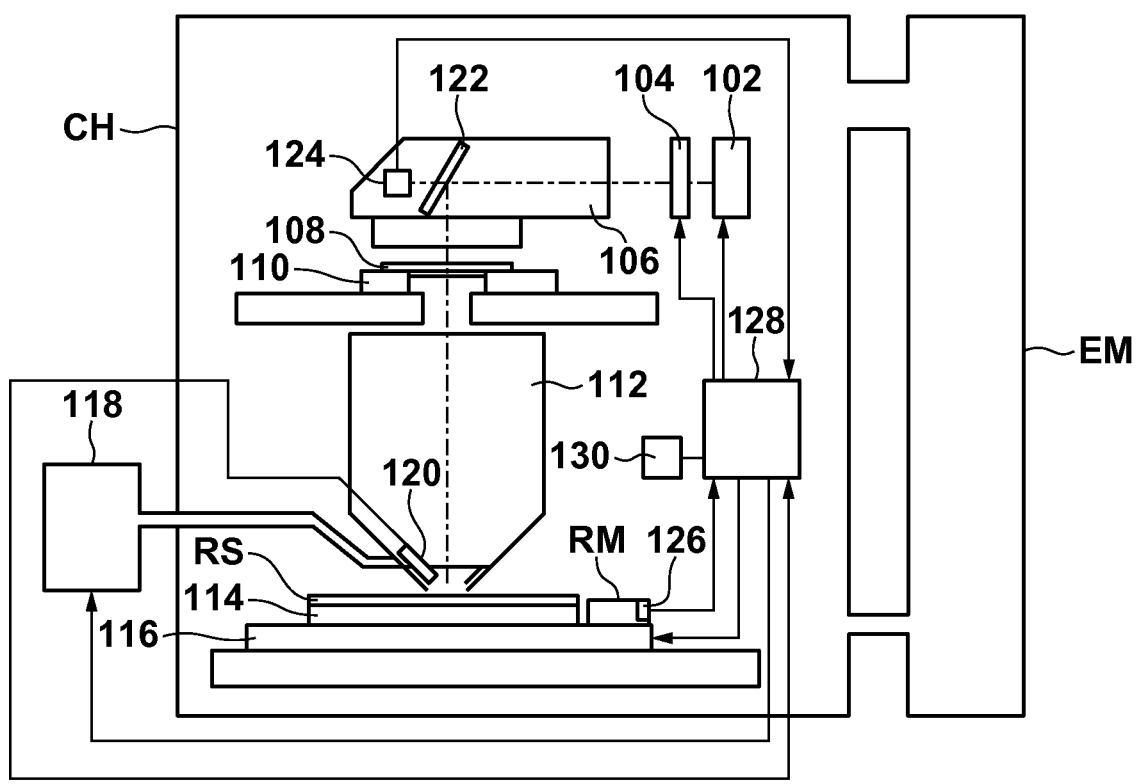
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 according to an aspect of the present invention. The exposure apparatus 1 is a lithography apparatus which performs a transfer process of transferring a reticle (mask) pattern onto a substrate by the step and scan scheme. Note however that the exposure apparatus 1 can also use other exposure schemes such as the step and repeat scheme.

The exposure apparatus 1 includes a light source 102, a dimming unit 104, an illumination optical system 106, a reticle stage 110 which moves while holding a reticle 108, a projection optical system 112, and a substrate stage 116 which moves while holding a substrate 114. The exposure apparatus 1 also includes a gas supply unit 118, an oxygen meter 120, a beam splitter 122, an integration sensor 124, a measuring instrument 126, a control unit 128, and a storage unit 130. The respective units of the exposure apparatus 1 are arranged in a chamber CH which defines an exposure chamber. The atmosphere in the chamber CH is maintained at an air atmosphere whose temperature and humidity are controlled by an atmosphere maintaining unit EM.

The light emitted from the light source 102 such as a mercury lamp, ArF excimer laser, or KrF excimer laser passes through the dimming unit 104 and the illumination optical system 106 and illuminates the reticle 108. The light which has passed through the pattern on the reticle 108 is projected onto a resist RS applied on the substrate 114 through the projection optical system 112. The dimming unit 104 functions as an adjustment unit for adjusting the light emitted from the light source 102, that is, the illuminance of the light applied to the substrate 114, and is formed from an ND filter in this embodiment. Note however that it is possible to adjust the illuminance of light by changing the voltage applied to the mercury lamp forming the light source 102 or changing the distance between the light source 102 and the illumination optical system 106.

The reticle stage 110 movably holds the reticle 108. The substrate stage 116 movably holds the substrate 114. A reference mark RM for calibration is formed on an end portion of the substrate stage 116.

The gas supply unit 118 (an oxygen concentration adjustment unit) supplies an inert gas to the space (local space) between the projection optical system 112 and the substrate 114 (substrate stage 116) and adjusts an oxygen concentration in the space. In this embodiment, the gas supply unit 118 supplies either a mixed gas of air and an inert gas or air to the local space through a gas supply nozzle. The inert gas includes, for example, a nitrogen gas. The gas supply unit 118 may also be configured to separately contain a plurality of types of mixed gases with different composition ratios between inert gas and air and different oxygen concentrations and change the oxygen concentration in the local space replaced with a mixed gas. It is preferable to almost close the local space replaced with the gas supplied from the gas supply unit 118 with a partition wall or the like enclosing it to efficiently decrease the oxygen concentration by preventing the mixed gas from dispersing when exposing the substrate 114.

The oxygen meter (second measuring unit) 120 is placed near the local space between the projection optical system 112 and the substrate 114 to measure the oxygen concentration in the local space. The oxygen meter 120 can also be placed at a position where it can perform alternative measurement of the oxygen concentration between the projection optical system 112 and the substrate 114. For example, placing the oxygen meter 120 between the gas supply unit 118 and projection optical system 112 (near its final surface) can perform alternative measurement of the oxygen concentration in the local space.

The beam splitter 122 splits light (exposure light) for illuminating the reticle 108 after passing through the illumination optical system 106 into light propagating toward the substrate 114 and light propagating toward the integration sensor 124 at a light intensity ratio of, for example, 1:1/several millions. The integration sensor 124 is used to indirectly measure the integrated amount (dose) of exposure light applied to the substrate 114 by integrating the amount of light (light amount) entering the integration sensor 124.

The measuring instrument (first measuring unit) 126 is placed on the substrate stage 116 to measure the illuminance and illuminance distribution of light entering the surface on which the substrate 114 is placed, that is, the image plane of the projection optical system 112. In other words, the measuring instrument 126 functions as an obtaining unit which obtains the illuminance data and illuminance distribution data of light entering the substrate 114. The measuring instrument 126 includes, for example, a light shielding plate having a pinhole and a photoelectric conversion device which detects light passing through the pinhole. The photoelectric conversion device included in the measuring instrument 126 is not limited to one photoelectric conversion device but may be a line sensor or image sensor including a plurality of photoelectric conversion devices. Information concerning the area of the pinhole of the light shielding plate is stored in the storage unit 130 and used to obtain illuminance based on an output from the measuring instrument 126.

When measuring the illuminance of light applied to the substrate 114, the apparatus moves the substrate stage 116 to place the measuring instrument 126 near a target measurement position. When measuring the illuminance distribution of light applied to the substrate 114, the apparatus causes the measuring instrument 126 to measure illuminance while performing, for example, step movement of the substrate stage 116 with a predetermined step width. The apparatus then obtains the illuminance distribution of light applied to the substrate 114 based on a plurality of positions of the substrate stage 116 (that is, a plurality of positions of the measuring instrument 126) and a plurality of illuminances measured by the measuring instrument 126 at the respective positions.

The control unit 128 includes a CPU and the like and controls the overall (operation) exposure apparatus 1. In this embodiment, the control unit 128 controls a transfer process of transferring the pattern on the reticle 108 onto the substrate 114 through the light source 102, the dimming unit 104, the reticle stage 110, the substrate stage 116, the gas supply unit 118, and the like. For example, the control unit 128 controls the supply of a mixed gas (inert gas) by the gas supply unit 118, based on the oxygen concentration measured by the oxygen meter 120, so as to set the oxygen concentration in the local space between the projection optical system 112 and the substrate 114 to a target oxygen concentration. The control unit 128 controls the light intensity of light emitted from the light source 102 and the transmittance at the dimming unit 104 based on the dose measured by the integration sensor 124. In addition, the control unit 128 calculates the illuminance of light entering the substrate 114 from an output from the measuring instrument 126 and controls the light intensity of light emitted from the light source 102 and the transmittance at the dimming unit 104 based on the calculated illuminance. In this case, the control unit 128 uses an output from the measuring instrument 126 as a reference for the calibration of the integration sensor 124. Obtaining the correlation between the illuminance measured by the measuring instrument 126 and the dose measured by the integration sensor 124 in advance allows the control unit 128 to calculate the illuminance of light entering the substrate 114 based on the dose measured by the integration sensor 124. The control unit 128 can adjust the illuminance during an exposure process by controlling the light intensity of light emitted from the light source 102 or the transmittance at the dimming unit 104 based on the calculated illuminance.

An example of an exposure process in the exposure apparatus 1 will be described with reference to FIG. 2. As described above, the control unit 128 performs this exposure process by comprehensively controlling the respective units of the exposure apparatus 1.

In the exposure apparatus 1, the optimal value of the oxygen concentration in the local space between the projection optical system 112 and the substrate 114, the optimal value of the illuminance of light applied to the substrate 114, and the optimal value of the dose on the substrate vary in accordance with the type of resist RS applied to the substrate 114. In this case, the "optimal values" are the oxygen concentration in the local space, the illuminance of light applied to the substrate 114, and the dose on the substrate which are required to make the dimensional values of a pattern to be transferred onto the substrate 114 fall within allowable ranges, respectively. Therefore, the relationship between oxygen concentration, illuminance, and dose for the dimensions of a pattern to be transferred onto the substrate 114 is obtained in advance by experiments and the like and stored in the storage unit 130 in advance. In this case, such a relationship may be stored as an exposure recipe instead of being singly stored. If the resist RS to be applied to the substrate 114 is a resist selected from a plurality of color resists, blue, green, and red resists differ in oxygen concentration, illuminance, and dose for the dimensions of a pattern to be transferred onto the substrate 114. This embodiment therefore obtains information representing the correspondence relationship between oxygen concentration, illuminance, and dose for the dimensions of a pattern to be transferred onto the substrate 114 for each type of resist and stores the information as an exposure recipe in the storage unit 130.

Figure 2:
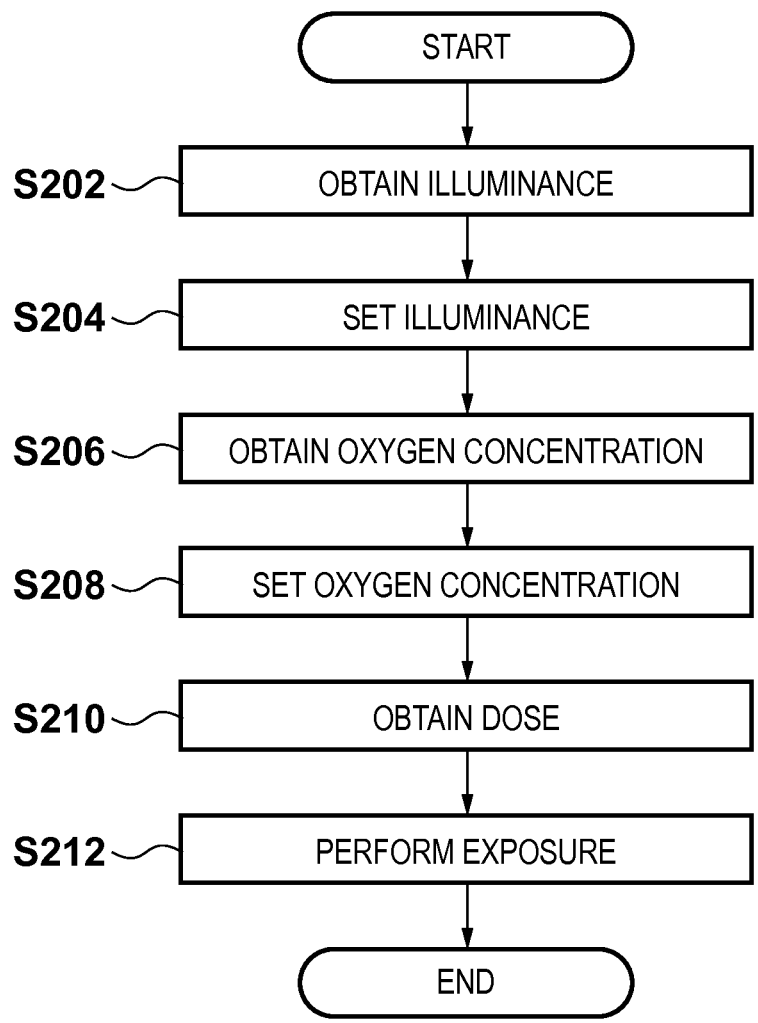
FIG. 2 is a flowchart for explaining an example of an exposure process in the exposure apparatus shown in FIG. 1.

Referring to FIG. 2, in step S202, the control unit 128 obtains illuminance data required for an exposure process (that is, data required to make the dimensions of a pattern to be transferred onto the substrate 114 fall within allowable ranges) from the exposure recipe stored in the storage unit 130.

In step S204, the control unit 128 sets the illuminance of light to be applied to the substrate 114. More specifically, the control unit 128 controls at least one of the light source 102 or the dimming unit 104 by using the integration sensor 124 or the measuring instrument 126 so as to set the illuminance of light to be applied to the substrate 114 to the illuminance obtained in step S202.

In step S206, the control unit 128 obtains oxygen concentration data required for an exposure process (that is, data required to make the dimensions of a pattern to be transferred onto the substrate 114 fall within allowable ranges) from the exposure recipe stored in the storage unit 130.

In step S208, the control unit 128 sets an oxygen concentration in the local space between the projection optical system 112 and the substrate 114. More specifically, the control unit 128 controls the gas supply unit 118 by using the oxygen meter 120 so as to set the oxygen concentration in the local space to the oxygen concentration obtained in step S206.

In step S210, the control unit 128 obtains dose data required for the exposure process (that is, data required to make the dimensions of a pattern to be transferred onto the substrate 114 fall within allowable ranges) from the exposure recipe stored in the storage unit 130.

In step S212, the control unit 128 exposes the substrate 114 (the resist RS applied on it). More specifically, the control unit 128 starts to expose the substrate 114 with the illuminance set in step S204 in the oxygen concentration atmosphere set in step S208 (that is, starts to irradiate the substrate 114 with exposure light from the projection optical system 112). When the dose on the substrate reaches the dose obtained in step S210, the control unit 128 finishes exposing the substrate 114 (that is, finishes irradiating the substrate 114 with exposure light from the projection optical system 112).

According to the exposure process shown in FIG. 2, since the apparatus can expose the substrate 114 with an optimal illuminance corresponding to the type of resist, it is possible to make the dimensions of a pattern on the reticle 108 which is transferred onto the substrate 114 fall within allowable ranges.

Continuing exposure may decrease the illuminance of light applied to the substrate 114 (that is, may fail to obtain a predetermined illuminance). If, for example, the light source 102 deteriorates, especially when a mercury lamp is used as the light source 102, it is known that the illuminance decreases by about 30% in two months. In addition, the transmittance of the illumination optical system 106 or projection optical system 112 decreases over a medium and long term. In this case, even if the light source 102 is replaced, it is not possible to implement optimal illuminance corresponding to the type of resist. This makes it impossible to make the dimensions of a pattern transferred onto the substrate 114 fall within allowable ranges. In such a case, for example, performing the exposure process shown in FIG. 3 can make the dimensions of a pattern transferred onto the substrate 114 fall within allowable ranges.

Figure 3:
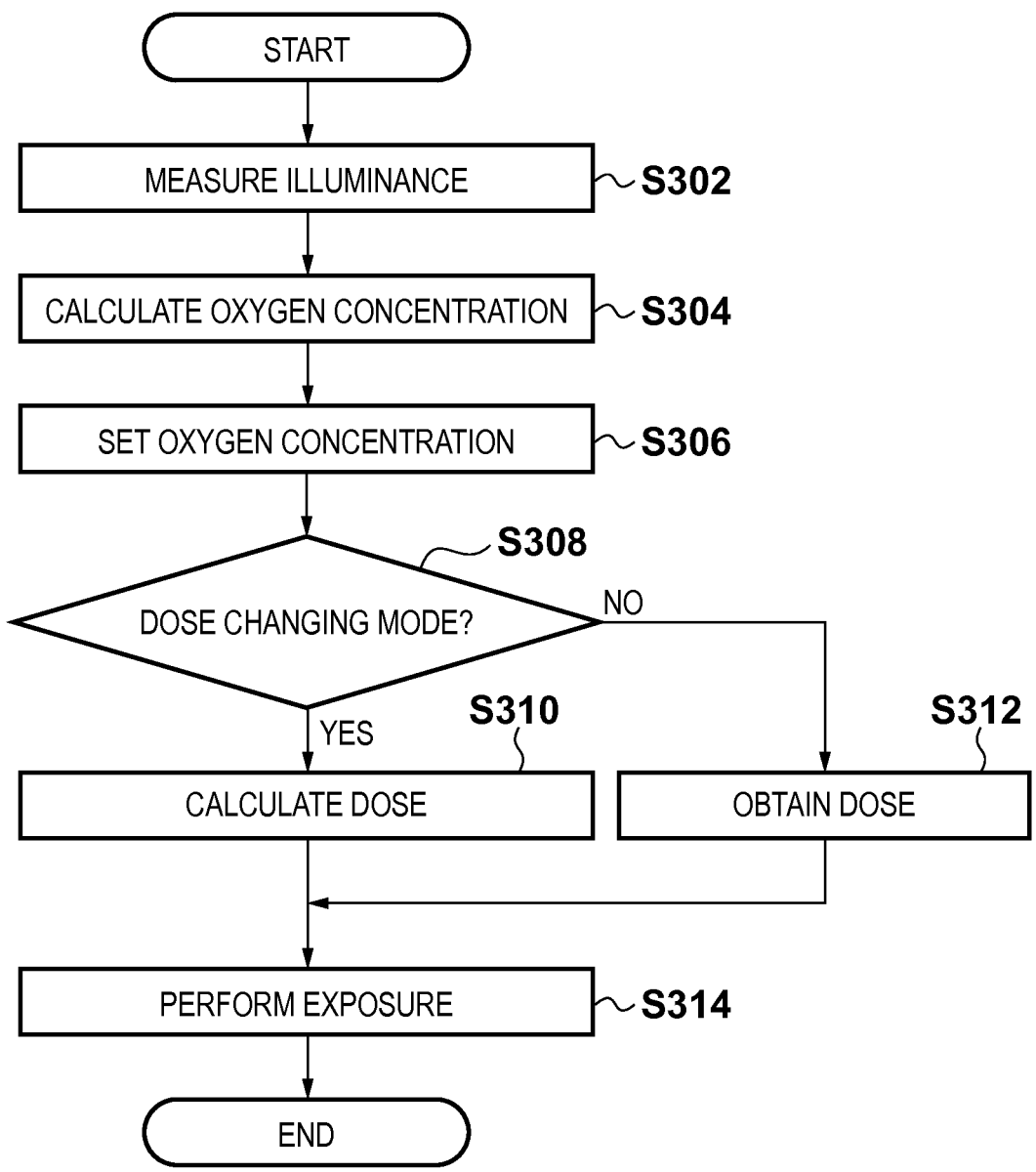
FIG. 3 is a flowchart for explaining another example of an exposure process in the exposure apparatus shown in FIG. 1.

FIG. 3 is a flowchart for explaining another example of an exposure process in the exposure apparatus 1. As described above, the control unit 128 performs this exposure process by comprehensively controlling the respective units of the exposure apparatus 1.

As described above, in the exposure apparatus 1, the optimal value of the oxygen concentration in the local space between the projection optical system 112 and the substrate 114, the optimal value of the illuminance of light applied to the substrate 114, and the optimal value of the dose on the substrate vary in accordance with the type of resist RS applied to the substrate 114. Therefore, the relationship between oxygen concentration, illuminance, and dose for the dimensions of a pattern to be transferred onto the substrate 114 is obtained in advance by experiments and the like and stored in the storage unit 130 in advance.

In addition, the apparatus obtains, in advance, oxygen concentration data required to make the dimensions of a pattern transferred onto the substrate 114 fall within allowable ranges when the illuminance of light applied to the substrate 114 changes, and stores the data in the storage unit 130. In other words, the apparatus stores, in the storage unit 130 in advance, information (first information) representing the correspondence relationship between the illuminance of light applied to the substrate 114 and the oxygen concentration in the local space between the projection optical system 112 and the substrate 114, which is required to make the dimensions of a pattern transferred onto the substrate 114 fall within allowable ranges.

Figure 4:
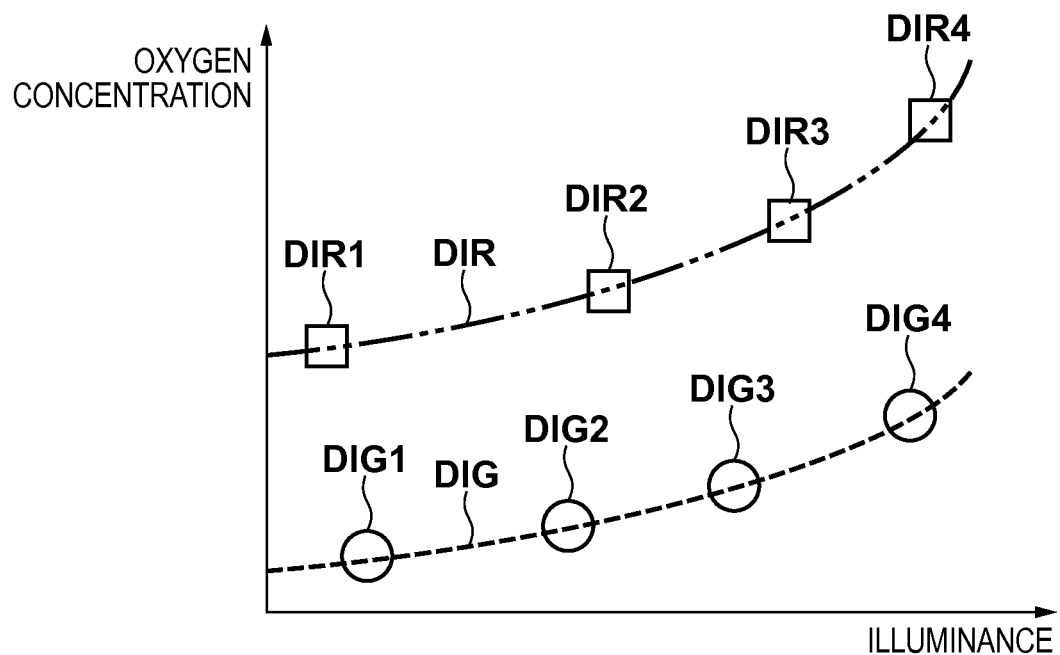
FIG. 4 is a graph showing an example of information representing the correspondence relationship between the illuminance of light applied to a substrate and the oxygen concentration in the local space between a projection optical system and a substrate.

More specifically, as shown in FIG. 4, it is possible to calculate an optimal oxygen concentration for an arbitrary illuminance by storing, in the storage unit 130 in advance, information obtained by approximating the correspondence relationship between the illuminance of light applied to the substrate 114 and the oxygen concentration in the local space with a function. In addition, since such information varies in accordance with the type of resist, it is preferable to store such information in advance for each type of resist. For example, referring to FIG. 4, DIR1, DIR2, DIR3, and DIR4 represent the correspondence relationship between illuminance and oxygen concentration, for a red resist, which is required to make the dimensions of a pattern transferred onto the substrate 114 fall within allowable ranges. DIR represents a function approximating the correspondence relationship represented by DIR1 to DIR4. Referring to FIG. 4, DIG1, DIG2, DIG3, and DIG4 represent the correspondence relationship between illuminance and oxygen concentration, for a green resist, which is required to make the dimensions of a pattern transferred onto the substrate 114 fall within allowable ranges. DIG represents a function approximating the correspondence relationship represented by DIG1 to DIG4. Note however that in this case, the apparatus obtains the correspondence relationship between illuminance and oxygen concentration which is required to make the dimensions of a pattern transferred onto the substrate 114 fall within allowable ranges, while keeping the dose on the substrate constant. FIG. 4 uses the illuminance of light applied to the substrate 114 as the abscissa and the oxygen concentration in the local space between the projection optical system 112 and the substrate 114 as the ordinate.

In addition, the apparatus obtains, in advance, the data of dose on the substrate which is required to make the dimensions of a pattern transferred onto the substrate 114 fall within allowable ranges when the oxygen concentration in the local space between the projection optical system 112 and the substrate 114 changes, and stores the data in the storage unit 130. In other words, the apparatus stores, in the storage unit 130 in advance, information representing the correspondence relationship between the oxygen concentration in the local space between the projection optical system 112 and the substrate 114 and the dose on the substrate, which is required to make the dimensions of a pattern transferred onto the substrate 114 fall within allowable ranges.

Figure 5:
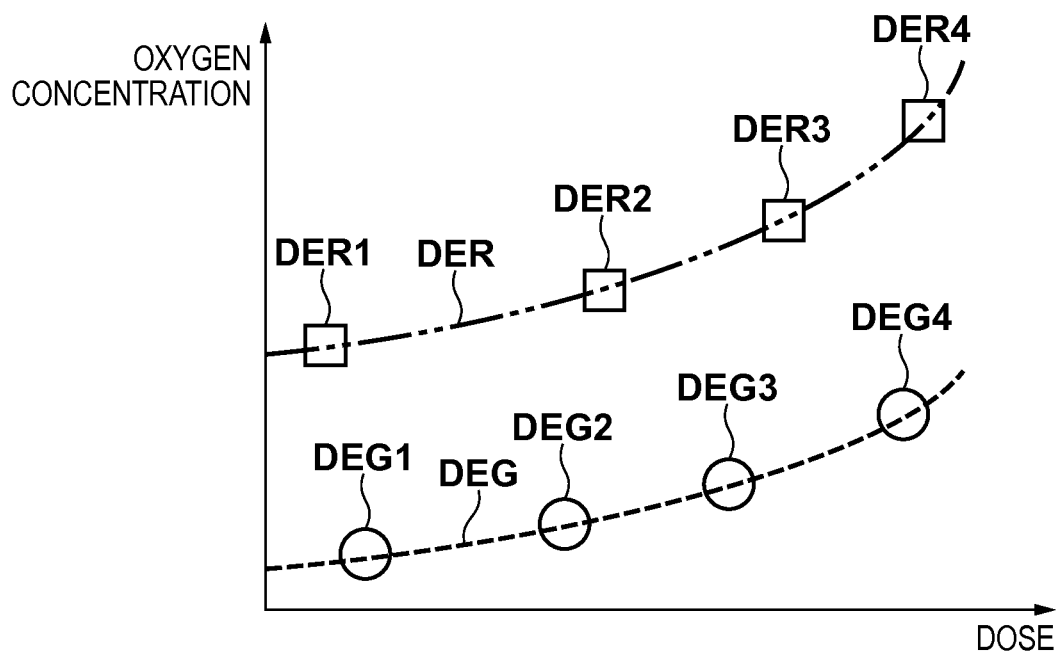
FIG. 5 is a graph showing an example of information representing the correspondence relationship between the oxygen concentration in the local space between the projection optical system and the substrate and the dose on the substrate.

More specifically, as shown in FIG. 5, it is possible to calculate an optimal dose for an arbitrary oxygen concentration by storing, in the storage unit 130 in advance, information obtained by approximating the correspondence relationship between the oxygen concentration in the local space between the projection optical system 112 and the substrate 114 and the dose on the substrate with a function. In addition, since such information varies in accordance with the type of resist, it is preferable to store such information in advance for each type of resist.

For example, referring to FIG. 5, DER1, DER2, DER3, and DER4 represent the correspondence relationship between dose and oxygen concentration, for a red resist, which is required to make the dimensions of a pattern transferred onto the substrate 114 fall within allowable ranges. DER represents a function approximating the correspondence relationship represented by DER1 to DER4. Referring to FIG. 5, DEG1, DEG2, DEG3, and DEG4 represent the correspondence relationship between dose and oxygen concentration, for a green resist, which is required to make the dimensions of a pattern transferred onto the substrate 114 fall within allowable ranges. DEG represents a function approximating the correspondence relationship represented by DEG1 to DEG4. Note however that in this case, the apparatus obtains the relationship between dose and oxygen concentration which is required to make the dimensions of a pattern transferred onto the substrate 114 fall within allowable ranges, while keeping the illuminance of light applied to the substrate 114 constant. FIG. 5 uses the dose on the substrate as the abscissa and the oxygen concentration in the local space between the projection optical system 112 and the substrate 114 as the ordinate.

The apparatus may also store, in the storage unit 130, information obtained by individually optimizing the relationship between the oxygen concentration in the local space between the projection optical system 112 and the substrate 114, the illuminance of light applied to the substrate 114, and the dose on the substrate. Alternatively, the apparatus may store, in the storage unit 130, information (second information) representing a three-dimensional function combining the correspondence relationships shown in FIGS. 4 and 5, that is, the correspondence relationship between illuminance, oxygen concentration in the local space, and dose which is required to make the dimensions of a pattern transferred onto the substrate 114 fall within allowable ranges. Note that the apparatus may store, in the storage unit 130, a polynomial function including exposure heat and exposure wait time as parameters in addition to illuminance, oxygen concentration in the local space, and dose.

Referring to FIG. 3, in step S302, the control unit 128 measures the illuminance of light applied to the substrate 114 by using the integration sensor 124 or the measuring instrument 126. Actually measuring the illuminance of light applied to the substrate 114 in this manner makes it possible to calculate an optical oxygen concentration at the time of an exposure process. Alternatively, if the storage unit 130 or the like stores illuminance information representing the illuminance of light applied to the substrate 114 and a temporal deterioration in illuminance at each time, it is possible to obtain the data of the illuminance of light applied to the substrate 114 from such illuminance information.

In step S304, the control unit 128 calculates an oxygen concentration required to make the dimensions of a pattern transferred onto the substrate 114 fall within allowable ranges based on the illuminance measured in step S302 and the correspondence relationship (see FIG. 4) between the illuminance and oxygen concentration stored in the storage unit 130.

In step S306, the control unit 128 sets an oxygen concentration in the local space between the projection optical system 112 and the substrate 114. More specifically, the control unit 128 controls the gas supply unit 118 by using the oxygen meter 120 so as to set the oxygen concentration in the local space to the oxygen concentration calculated in step S304.

In step S308, the control unit 128 determines whether the mode set in the exposure apparatus 1 is a dose changing mode. In this case, the dose changing mode is a mode of changing the dose on the substrate in accordance with a change in the illuminance of light applied to the substrate 114 or the oxygen concentration in the local space between the projection optical system 112 and the substrate 114. Since changing the dose will influence the throughput, the mode (normal mode) of keeping the dose constant is generally set as a default in the exposure apparatus. If, however, the illuminance or dose greatly changes, keeping the dose constant makes it impossible to make the dimensions of a pattern transferred onto the substrate 114 fall within allowable ranges, this embodiment is configured to set the dose changing mode in accordance with an instruction from the user. If the dose changing mode is set in the exposure apparatus 1, the process shifts to step S310. If the dose changing mode is not set in the exposure apparatus 1 (that is, the normal mode is set), the process shifts to step S312.

In step S310, the control unit 128 calculates a dose on the substrate. More specifically, the control unit 128 calculates a dose required to make the dimensions of a pattern transferred onto the substrate 114 fall within allowable ranges based on the oxygen concentration calculated in step S304 and the correspondence relationship (see FIG. 5) between dose and oxygen concentration stored in the storage unit 130. Alternatively, the control unit 128 may calculate a dose based on the illuminance measured in step S302, the oxygen concentration calculated in step S304, and the correspondence relationship between illuminance and oxygen concentration stored in the storage unit 130.

In step S312, the control unit 128 obtains dose data required for an exposure process from the exposure recipe stored in the storage unit 130.

In step S314, the control unit 128 exposes the substrate 114 (the resist RS applied to it). More specifically, the control unit 128 starts to expose the substrate 114 under an atmosphere of the oxygen concentration set in step S306 (that is, starts to irradiate the substrate 114 with exposure light from the projection optical system 112). When the dose on the substrate reaches the dose calculated in the step S310 or the dose obtained in step S312, the control unit 128 finishes exposing the substrate 114 (that is, finishes irradiating the substrate 114 with exposure light from the projection optical system 112).

Figure 6:
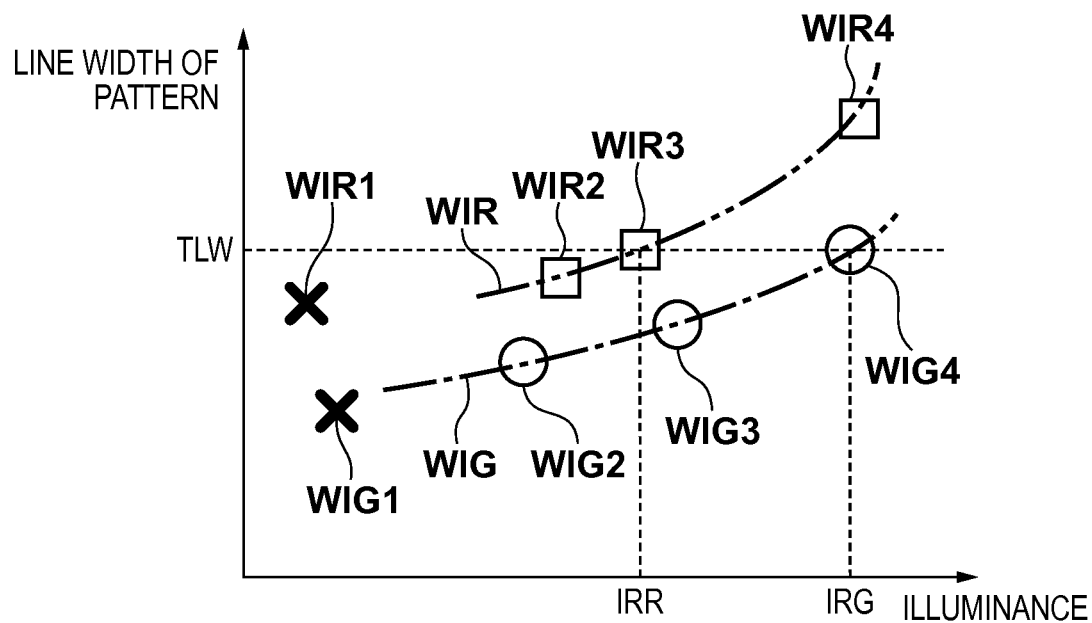
FIG. 6 is a graph showing the relationship between the illuminance of light applied to the substrate and the line width of a pattern transferred onto the substrate.

The effects obtained by the exposure process shown in FIG. 3 will be described below. FIG. 6 is a graph showing the relationship between the illuminance of light applied to the substrate 114 and the line width of a pattern transferred onto the substrate 114. FIG. 6 uses the illuminance as the abscissa and the line width of the pattern as the ordinate. Referring to FIG. 6, WIR1, WIR2, WIR3, and WIR4 represent the relationship between the illuminance and the line width of the pattern for a red resist, and WIR represents a function approximating the relationship represented by WIR2 to WIR4. Note that WIR1 indicates that energy sufficient for a photopolymerization causing substance in the resist has not been supplied because of a lack in illuminance at the time of an exposure process, and no pattern has been resolved. In addition, referring to FIG. 6, WIG1, WIG2, WIG3, and WIG4 represent the relationship between the illuminance and the line width of the pattern for a green resist, and WIG represents a function approximating the relationship represented by WIG2 to WIG4. Note that WIG1, like WIR1, indicates that no pattern has been resolved. In addition, in order to avoid a reduction in throughput due to an increase in dose on the substrate, it is preferable to obtain the relationship between the illuminance and the line width of a pattern while keeping the dose constant.

The relationship between the line width of a pattern (target pattern) to be transferred onto the substrate 114 and the illuminance of light applied to the substrate 114 will be described with reference to FIG. 6. In general, when exposing the substrate 114, the apparatus has set exposure conditions to obtain the line width of the target pattern. For example, obviously, if the line width of a target pattern is a line width TLW, the apparatus exposes a red resist with an illuminance IRR corresponding to WIR3, and exposes a green resist with an illuminance IRG corresponding to WIG4, thereby obtaining the line width TLW of the target pattern.

Figure 7:
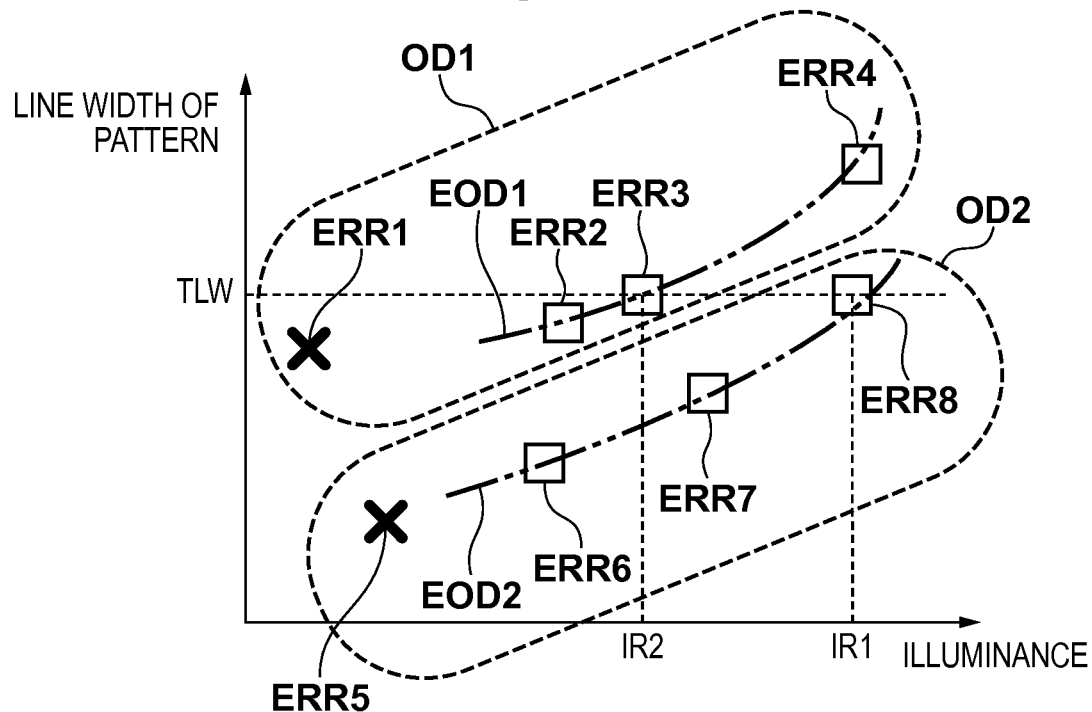
FIG. 7 is a graph showing the relationship between the illuminance of light applied to the substrate, the oxygen concentration in the local space between the projection optical system and the substrate, and the line width of a pattern transferred onto the substrate.

FIG. 7 is a graph showing the relationship between the illuminance of light applied to the substrate 114, the oxygen concentration in the local space between the projection optical system 112 and the substrate 114, and the line width of a pattern transferred onto the substrate 114. Referring to FIG. 7, ERR1, ERR2, ERR3, and ERR4 represent the results obtained by exposing a red resist with an oxygen concentration OD1, and EOD1 represents a function approximating the results represented by ERR2 to ERR4. Note that ERR1 indicates that no pattern has been resolved. In addition, referring to FIG. 7, ERR5, ERR6, ERR7, and ERR8 represent the results obtained by exposing a red resist with an oxygen concentration OD2, and EOD2 represents a function approximating the results represented by ERR6 to ERR8. Note that ERR5 indicates that no pattern has been resolved.

Obviously from FIG. 7, in order to obtain the line width TLW of the target pattern, when performing exposure with the oxygen concentration OD2, the apparatus sets the illuminance of light applied to the substrate 114 to an illuminance IR1. As the illuminance of light applied to the substrate 114 decreases, the photopolymerization reaction decreases, resulting in variations in the line width of the pattern transferred onto the substrate 114. In general, to increase a photopolymerization reaction, it is conceivable to increase the dose. Since a dose is expressed by the product of an illuminance and an exposure time, it is necessary to prolong the exposure time while the illuminance has decreased. This leads to a reduction in throughput.

On the other hand, when the apparatus performs exposure with a decreased oxygen concentration in the local space between the projection optical system 112 and the substrate 114, since the hindrance of a photopolymerization reaction by oxygen decreases, the photopolymerization reaction of the resist progresses, resulting in variations in the line width of the pattern transferred onto the substrate 114. Therefore, while the illuminance has decreased from the illuminance IR1 to the illuminance IR2, it is possible to obtain the line width TLW of the target pattern by performing exposure upon decreasing the oxygen concentration in the local space from the oxygen concentration OD2 to the oxygen concentration OD1. In addition, since it is possible to obtain the line width TLW of the target pattern by reducing the hindrance of a photopolymerization reaction by oxygen, it is not necessary to increase the dose. This can prevent a decrease in throughput.

This embodiment has exemplified the line width of a pattern as an example of the dimensions of the pattern transferred onto the substrate 114. Note however that the dimensions of a pattern transferred onto the substrate 114 are not limited to the line width of the pattern and may be a pattern shape including verticality on a side surface of the pattern or other arbitrary evaluation indices for a pattern.

As described above, according to the exposure process shown in FIG. 3, even if the illuminance of light applied to the substrate 114 has decreased, it is possible to expose the substrate 114 with an optimal illuminance corresponding to the type of resist. Therefore, the exposure apparatus 1 can make the dimensions of a pattern transferred onto the substrate 114 fall within allowable ranges while suppressing an increase in dose which is a cause for a reduction in throughput.

In the exposure process shown in FIG. 3, the control unit 128 calculates the oxygen concentration in the local space between the projection optical system 112 and the substrate 114 based on the illuminance measured by the integration sensor 124 or the measuring instrument 126, and controls the gas supply unit 118 to set the oxygen concentration to the calculated oxygen concentration. Note that the control unit 128 may obtain the supply amount of inert gas or the like by the gas supply unit 118 (that is, instead of deciding an oxygen concentration) based on the illuminance measured by the integration sensor 124 or the measuring instrument 126, and directly control the gas supply unit 118.

In addition, while the apparatus exposes the substrate 114, the illuminance of light applied to the substrate 114 or the oxygen concentration in the local space between the projection optical system 112 and the substrate 114 sometimes greatly varies. In such a case, since the apparatus cannot make the dimensions of a pattern transferred onto the substrate 114 fall within allowable ranges, the apparatus may expose the substrate 114 while measuring variations (variation amounts) in illuminance or oxygen concentration and performing feedback control.

An exposure process will be described with reference to FIG. 8, in a case in which the illuminance of light applied to the substrate 114 or the oxygen concentration in the local space between the projection optical system 112 and the substrate 114 greatly varies. Since the processing in steps S802 to S812 is the same as that in steps S302 to S312 shown in FIG. 3, a detailed description of the processing will be omitted.

In step S814, the control unit 128 starts to expose the substrate 114 (the resist RS applied on it) under an atmosphere of the oxygen concentration set in step S806 (that is, starts to irradiate the substrate 114 with exposure light from the projection optical system 112).

In step S816, the control unit 128 measures the illuminance of light applied to the substrate 114 by using the integration sensor 124 or the measuring instrument 126. In this manner, measuring the illuminance of light applied to the substrate 114 since the start of exposure (that is, during the irradiation of the substrate 114 with light from the projection optical system 112) can maintain the illuminance of light applied to the substrate 114 at the illuminance measured in step S802.

In step S818, the control unit 128 determines whether a variation in the illuminance of light applied to the substrate 114 (the difference between the illuminance measured in step S802 and the illuminance measured in step S814) falls within an allowable range. In this case, the allowable range for variation in illuminance is set to a range in which a variation in illuminance does not influence the dimensions of a pattern transferred onto the substrate 114. If a variation in illuminance does not fall within the allowable range, the process shifts to step S820. If a variation in illuminance falls within the allowable range, the process shifts to step S822.

In step S820, the control unit 128 adjusts the illuminance of light applied to the substrate 114 based on the illuminance measured in step S816. More specifically, the control unit 128 controls the light intensity of light emitted from the light source 102 or the transmittance at the dimming unit 104 so as to set the illuminance of light applied to the substrate 114 to the illuminance measured in step S802 (that is, maintain the illuminance measured in step S802).

In step S822, the control unit 128 measures the oxygen concentration in the local space between the projection optical system 112 and the substrate 114 by using the oxygen meter 120. It is possible to maintain the oxygen concentration at the oxygen concentration set in step S806 by measuring the oxygen concentration in the local space from the start of exposure (that is, during the irradiation of the substrate 114 with light from the projection optical system 112).

In step S824, the control unit 128 determines whether a variation in the oxygen concentration in the local space between the projection optical system 112 and the substrate 114 (the difference between the oxygen concentration set in step S806 and the oxygen concentration measured in step S822) falls within an allowable range. In this case, the allowable range for variation in oxygen concentration is set to a range in which a variation in oxygen concentration does not influence the dimensions of a pattern transferred onto the substrate 114. If a variation in oxygen concentration does not fall within the allowable range, the process shifts to step S826. If a variation in oxygen concentration falls within the allowable range, the process shifts to step S828.

In step S826, the control unit 128 adjusts the oxygen concentration in the local space between the projection optical system 112 and the substrate 114 based on the oxygen concentration measured in step S822. More specifically, the control unit 128 controls the gas supply unit 118 to set the oxygen concentration in the local space between the projection optical system 112 and the substrate 114 to the oxygen concentration set in step S806 (that is, to maintain the oxygen concentration at the oxygen concentration set in step S806).

In step S828, the control unit 128 determines whether the dose on the substrate has reached the dose calculated in step S810 or the dose (target dose) obtained in step S812. If the dose on the substrate has not reached the dose calculated in step S810 or the dose obtained in step S812, the process shifts to step S830 to continue exposure on the substrate 114. If the dose on the substrate has reached the dose calculated in step S810 or the dose obtained in step S812, the process shifts to step S832 to finish the exposure on the substrate 114.

Figure 8:
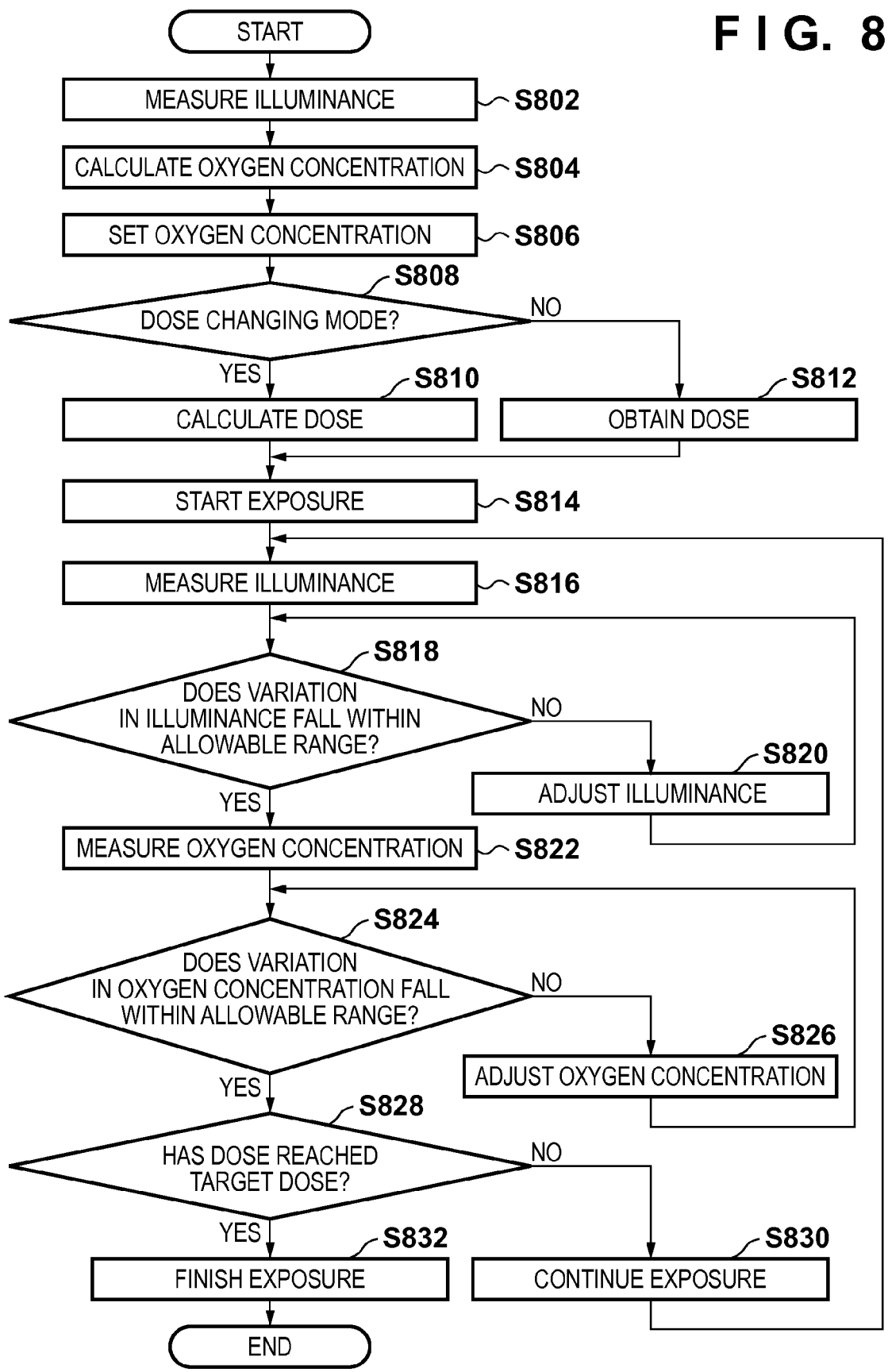
FIG. 8 is a flowchart for explaining another example of an exposure process in the exposure apparatus shown in FIG. 1.

As described above, according to the exposure process shown in FIG. 8, even if the illuminance of light applied to the substrate 114 or the oxygen concentration in the local space between the projection optical system 112 and the substrate 114 greatly varies, it is possible to make the dimensions of a pattern transferred onto the substrate 114 fall within allowable ranges.

In some case, the cycle of variation in the illuminance of light applied to the substrate 114 or the oxygen concentration in the local space between the projection optical system 112 and the substrate 114 is too short to control. In such a case, for example, performing the exposure process shown in FIG. 9 can make the dimensions of a pattern transferred onto the substrate 114 fall within allowable ranges. The processing in steps S902 to S912 is the same as that in steps S302 to S312 shown in FIG. 3, and hence a detailed description of the processing will be omitted.

In step S914, the control unit 128 starts to expose the substrate 114 (the resist RS applied on it) under an atmosphere of the oxygen concentration set in step S906 (that is, starts to irradiate the substrate 114 with exposure light from the projection optical system 112).

In step S916, the control unit 128 determines whether the mode set in the exposure apparatus 1 is an illuminance control mode. In this case, the illuminance control mode is a mode of repeatedly measuring the oxygen concentration in the local space between the projection optical system 112 and the substrate 114 and deciding/setting the illuminance of light applied to the substrate 114 during the irradiation of the substrate 114 with light from the projection optical system 112. Assume that in this embodiment, when the illuminance control mode is not set in the exposure apparatus 1, an oxygen concentration control mode is set. The oxygen concentration control mode is a mode of repeatedly measuring the illuminance of light applied to the substrate 114 and deciding/setting the oxygen concentration in the local space between the projection optical system 112 and the substrate 114 during the irradiation of the substrate 114 with light from the projection optical system 112.

When the illuminance control mode is set in the exposure apparatus 1, the process shifts to step S918. In step S918, the control unit 128 measures the oxygen concentration in the local space between the projection optical system 112 and the substrate 114 by using the oxygen meter 120. In step S920, the control unit 128 calculates an illuminance required to make the dimensions of a pattern transferred onto the substrate 114 fall within allowable ranges based on the oxygen concentration measured in step S918 and the relative relationship between the oxygen concentration and dose stored in the storage unit 130. In step S922, the control unit 128 adjusts the illuminance of light applied to the substrate 114. More specifically, the control unit 128 controls the light intensity of light emitted from the light source 102 or the transmittance at the dimming unit 104 (an illuminance adjustment unit) so as to set the illuminance of light applied to the substrate 114 to the illuminance calculated in step S920.

If the illuminance control mode is not set in the exposure apparatus 1 (that is, the oxygen concentration control mode is set), the process shifts to step S924. In step S924, the control unit 128 measures the illuminance of light applied to the substrate 114 by using the integration sensor 124 or the measuring instrument 126. In step S926, the control unit 128 calculates an oxygen concentration in the local space which is required to make the dimensions of a pattern transferred onto the substrate 114 based on the illuminance measured in step S924 and the relative relationship between the oxygen concentration and dose stored in the storage unit 130. In step S928, the control unit 128 adjusts the oxygen concentration in the local space between the projection optical system 112 and the substrate 114. More specifically, the control unit 128 controls the gas supply unit 118 so as to set the oxygen concentration in the local space between the projection optical system 112 and the substrate 114 to the oxygen concentration calculated in step S926.

In step S930, the control unit 128 determines whether the dose on the substrate has reached the dose calculated in step S910 or the dose (target dose) obtained in step S912. If the dose on the substrate has not reached the dose calculated in step S910 or the dose obtained in step S912, the process shifts to step S932 to continue exposure on the substrate 114. If the dose on the substrate has reached the dose calculated in step S910 or the dose obtained in step S912, the process shifts to step S934 to finish exposure on the substrate 114.

Figure 9:
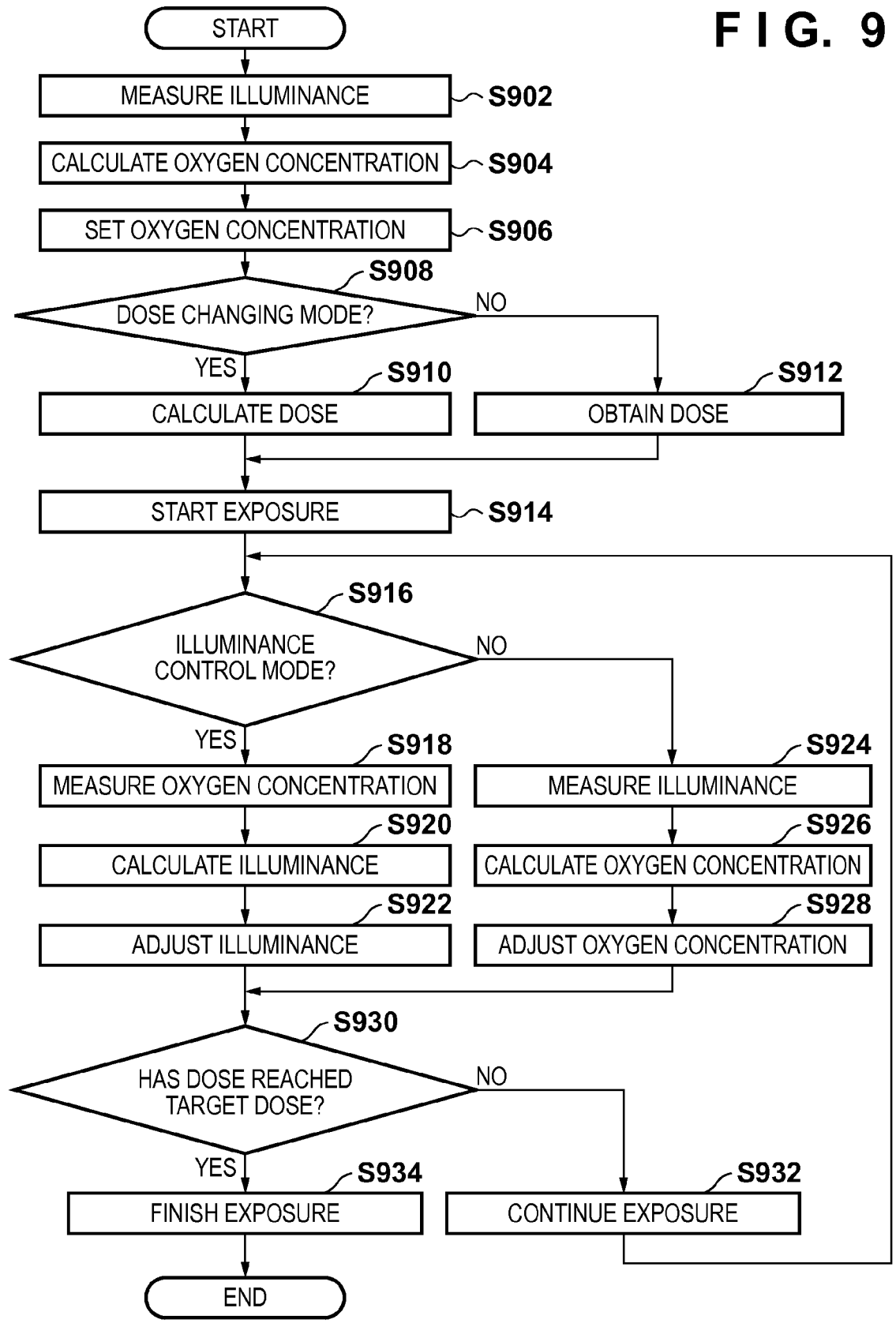
FIG. 9 is a flowchart for explaining another example of an exposure process in the exposure apparatus shown in FIG. 1.

As described above, according to the exposure process shown in FIG. 9, even if the cycle of variation in the illuminance of light applied to the substrate 114 or the oxygen concentration in the local space between the projection optical system 112 and the substrate 114 is short, it is possible to make the dimensions of a pattern transferred onto the substrate 114 fall within allowable ranges.

An example of an index for selecting (setting) the illuminance control mode will be described. When an inert gas is supplied from the gas supply unit 118 to the local space between the projection optical system 112 and the substrate 114, the inert gas mixes with air existing in the local space. This may require for the oxygen concentration in the local space to take time to reach the calculated oxygen concentration. In addition, in consideration of interference between the exposure apparatus 1 and each unit, it is difficult to place the gas supply unit 118 (its gas supply nozzle) near the local space between the projection optical system 112 and the substrate 114. It is therefore difficult to control the oxygen concentration in the local space between the projection optical system 112 and the substrate 114 with high response.

In addition, as compared with a decrease in illuminance due to a deterioration of the light source 102, a variation in illuminance in a short time of about several hundred ms of exposure on the substrate 114 can be regarded as small. The illuminance of light emitted from the light source 102 can be easily changed (adjusted) by the dimming unit 104, the voltages applied to the light source 102, the distance between the light source 102 and the illumination optical system 106, and the like. It is therefore possible to control the illuminance of light applied to the substrate 114 with high response as compared with the adjustment of the oxygen concentration in the local space between the projection optical system 112 and the substrate 114.

Setting the illuminance control mode as a default in the exposure apparatus 1 can suppress control on the oxygen concentration between the projection optical system 112 and the substrate 114, thereby exposing the substrate 114 with high throughput.

As described above, the exposure apparatus 1 can transfer the pattern on the reticle 108 onto the substrate 114 while suppressing a reduction in throughput. The exposure apparatus 1 can therefore economically provide high quality devices (semiconductor devices, liquid crystal display devices, flat panel displays (FPDs), and the like) with high throughput. Such devices are manufactured by using the exposure apparatus 1 through the step of exposing a substrate (wafer, glass plate, or the like) coated with a photoresist (photosensitizing agent), the step of developing the exposed substrate, and other known steps.

A form of placing a light source outside an exposure apparatus and guiding light from the light source to the illuminance optical system of the exposure apparatus also forms one aspect of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-284351 filed on Dec. 27, 2012, which is hereby incorporated by reference herein in its entirety.

What is claimed is:

1. An exposure apparatus which exposes a substrate, the apparatus comprising:
   an illumination optical system configured to illuminate a mask using light from a light source;
   a projection optical system configured to irradiate the substrate with light from a pattern on the mask;
   an adjustment unit configured to adjust an oxygen concentration in a space between the projection optical system and the substrate;
   an obtaining unit configured to obtain data of illuminance of light applied to the substrate; and
   a control unit configured to control the adjustment unit so as to set the oxygen concentration in the space to a predetermined concentration value based on the data of illuminance obtained by the obtaining unit.

2. The apparatus according to claim 1, wherein the control unit calculates an oxygen concentration in the space which is required to make a value of an evaluation index of a pattern transferred onto the substrate fall within an allowable range, based on the data of illuminance obtained by the obtaining unit, and
   controls the adjustment unit so as to set the oxygen concentration in the space to the calculated oxygen concentration.

3. The apparatus according to claim 2, further comprising a storage unit configured to store first information representing a correspondence relationship between an illuminance of light applied to the substrate and an oxygen concentration in the space, which is required to make a value of an evaluation index of a pattern transferred onto the substrate fall within an allowable range,
   wherein the control unit calculates an oxygen concentration in the space which is required to make a value of an evaluation index of a pattern transferred onto the substrate fall within an allowable range, based on first information stored in the storage unit.

4. The apparatus according to claim 3, wherein the control unit calculates a dose on the substrate which is required to make a value of an evaluation index of a pattern transferred onto the substrate fall within an allowable range, based on the data of illuminance obtained by the obtaining unit and the calculated oxygen concentration.

5. The apparatus according to claim 4, wherein the storage unit stores second information representing a correspondence relationship between an illuminance of light applied to the substrate, an oxygen concentration in the space, and a dose on the substrate, which is required to make a value of an evaluation index of a pattern transferred onto the substrate fall within an allowable range, and the control unit calculates a dose on the substrate which is required to make a value of an evaluation index of a pattern transferred onto the substrate fall within an allowable range, based on the second information stored in the storage unit.

6. The apparatus according to claim 2, further comprising:

an illuminance adjustment unit configured to adjust an illuminance of light applied to the substrate; and a first measuring unit configured to measure an illuminance of light applied to the substrate, wherein the control unit controls adjustment of an illuminance by the illuminance adjustment unit so as to maintain an illuminance measured by the first measuring unit at an illuminance when the oxygen concentration in the space is calculated, during irradiation of the substrate with light from the projection optical system.

7. The apparatus according to claim 2, further comprising a second measuring unit configured to measure an oxygen concentration in the space, and the control unit controls the adjustment unit so as to maintain an oxygen concentration measured by the second measuring unit at the calculated oxygen concentration during irradiation of the substrate with light from the projection optical system.

8. The apparatus according to claim 1, further comprising a first measuring unit configured to measure an illuminance of light applied to the substrate, wherein the control unit repeatedly controls the first measuring unit so as to measure an illuminance of light applied to the substrate during irradiation of the substrate with light from the projection optical system, calculates an oxygen concentration in the space which is required to make a value of an evaluation index of a pattern transferred onto the substrate fall within an allowable range, based on the illuminance measured by the first measuring unit, and controls the adjustment unit so as to set the oxygen concentration in the space to the calculated oxygen concentration.

9. The apparatus according to claim 1, further comprising a second measuring unit configured to measure an oxygen concentration in the space; and an illuminance adjustment unit configured to adjust an illuminance of light applied to the substrate, wherein the control unit repeatedly controls the second measuring unit so as to measure an oxygen concentration in the space during irradiation of the substrate with light from the projection optical system, calculates an illuminance of light applied to the substrate which is required to make a value of an evaluation index of a pattern transferred onto the substrate fall within an allowable range, based on the oxygen concentration measured by the second measuring unit, and controls adjustment of an illuminance by the illuminance adjustment unit so as to set an illuminance of light applied to the substrate to the calculated illuminance.

10. The apparatus according to claim 1, wherein the adjustment unit is a supply unit configured to supply an inert gas to the space.

11. An exposure apparatus which exposes a substrate, the apparatus comprising:

an illumination optical system configured to illuminate a mask using light from a light source;

a projection optical system configured to irradiate the substrate with light from a pattern on the mask;

an adjustment unit configured to adjust an oxygen concentration in a space between the projection optical system and the substrate;

a storage unit configured to store information representing a correspondence relationship between an oxygen concentration in the space, an illuminance of light applied to the substrate, and a dose on the substrate, which are required to make a value of an evaluation index of a pattern transferred onto the substrate fall within an allowable range; and a control unit configured to calculate a value of the oxygen concentration, the illuminance or the dose based on a correspondence relationship stored in the storage unit and configured to control the oxygen concentration, the illuminance or the dose so as to become the calculated value.

12. A device fabrication method comprising steps of:

exposing a substrate using an exposure apparatus; and performing a development process for the substrate exposed, wherein the exposure apparatus includes:

an illumination optical system configured to illuminate a mask using light from a light source;

a projection optical system configured to irradiate the substrate with light from a pattern on the mask;

an adjustment unit configured to adjust an oxygen concentration in a space between the projection optical system and the substrate;

an obtaining unit configured to obtain data of illuminance of light applied to the substrate; and a control unit configured to control the adjustment unit so as to set the oxygen concentration in the space to a predetermined concentration value based on the data of illuminance obtained by the obtaining unit.

13. A device fabrication method comprising steps of:

exposing a substrate using an exposure apparatus; and performing a development process for the substrate exposed, wherein the exposure apparatus includes:

an illumination optical system configured to illuminate a mask using light from a light source;

a projection optical system configured to irradiate the substrate with light from a pattern on the mask;

an adjustment unit configured to adjust an oxygen concentration in a space between the projection optical system and the substrate;

a storage unit configured to store information representing a correspondence relationship between an oxygen concentration in the space, an illuminance of light applied to the substrate, and a dose on the substrate, which are required to make a value of an evaluation index of a pattern transferred onto the substrate fall within an allowable range; and a control unit configured to calculate a value of the oxygen concentration, the illuminance or the dose based on a correspondence relationship stored in the storage unit and configured to control the oxygen concentration, the illuminance or the dose so as to become the calculated value.

14. An exposure apparatus which exposes a substrate, the apparatus comprising:

an illumination optical system configured to illuminate a mask using light from a light source;

a projection optical system configured to irradiate the substrate with light from a pattern on the mask;

a supply unit configured to supply a gas to a space between the projection optical system and the substrate;

an obtaining unit configured to obtain data of illuminance of light applied to the substrate; and a control unit configured to control supply of the gas by the supply unit so as to set the oxygen concentration in the space to a predetermined concentration value based on the data of illuminance obtained by the obtaining unit.

15. An exposure apparatus which exposes a substrate, the apparatus comprising:

an illumination optical system configured to illuminate a mask using light from a light source;

a projection optical system configured to irradiate the substrate with light from a pattern on the mask;

a supply unit configured to supply a gas to a space between the projection optical system and the substrate;

a storage unit configured to store information representing a correspondence relationship between an oxygen concentration in the space, an illuminance of light applied to the substrate, and a dose on the substrate, which are required to make a value of an evaluation index of a pattern transferred onto the substrate fall within an allowable range; and a control unit configured to calculate a value of the oxygen concentration, the illuminance or the dose based on a correspondence relationship stored in the storage unit and configured to control supply of the gas by the supply unit, the illuminance or the dose so as to become the calculated value.

16. A device fabrication method comprising steps of:

exposing a substrate using an exposure apparatus; and performing a development process for the substrate exposed, wherein the exposure apparatus includes:

an illumination optical system configured to illuminate a mask using light from a light source;

a projection optical system configured to irradiate the substrate with light from a pattern on the mask;

a supply unit configured to supply a gas to a space between the projection optical system and the substrate;

an obtaining unit configured to obtain data of illuminance of light applied to the substrate; and a control unit configured to control supply of the gas by the supply unit so as to set the oxygen concentration in the space to a predetermined concentration value based on the data of illuminance obtained by the obtaining unit.

17. A device fabrication method comprising steps of:

exposing a substrate using an exposure apparatus; and performing a development process for the substrate exposed, wherein the exposure apparatus includes:

an illumination optical system configured to illuminate a mask using light from a light source;

a projection optical system configured to irradiate the substrate with light from a pattern on the mask;

a supply unit configured to supply a gas to a space between the projection optical system and the substrate;

a storage unit configured to store information representing a correspondence relationship between an oxygen concentration in the space, an illuminance of light applied to the substrate, and a dose on the substrate, which are required to make a value of an evaluation index of a pattern transferred onto the substrate fall within an allowable range; and a control unit configured to calculate a value of the oxygen concentration, the illuminance or the dose based on a correspondence relationship stored in the storage unit and configured to control supply of the gas by the supply unit, the illuminance or the dose so as to become the calculated value.

* * * * *